United States Patent
Hasegawa et al.

(10) Patent No.: US 8,380,032 B2
(45) Date of Patent: Feb. 19, 2013

(54) SEMICONDUCTOR OPTICAL AMPLIFIER MODULE

(75) Inventors: Hideaki Hasegawa, Tokyo (JP); Masaki Funabashi, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 81 days.

(21) Appl. No.: 13/019,538

(22) Filed: Feb. 2, 2011

(65) Prior Publication Data

US 2011/0243494 A1    Oct. 6, 2011

(30) Foreign Application Priority Data

Feb. 4, 2010  (JP) ................................ 2010-023370

(51) Int. Cl.
*G02B 6/10* (2006.01)
*H01S 3/00* (2006.01)

(52) U.S. Cl. ............. 385/131; 385/14; 385/15; 385/129; 385/130; 385/132; 359/337; 359/27; 359/349; 359/341.41

(58) Field of Classification Search ............... 385/14–15, 385/129–132; 359/337, 127, 349, 341.41
See application file for complete search history.

(56) References Cited

U.S. PATENT DOCUMENTS 6,238,100 B1 *  5/2001  Sasaki et al. .................... 385/59
6,426,832 B1 *  7/2002  Kinoshita .................... 359/337
7,808,698 B2 * 10/2010  Akiyama ...................... 359/344
2006/0221438 A1 * 10/2006  Akiyama ...................... 359/344
2010/0284019 A1 * 11/2010  Fukuda ......................... 356/477

FOREIGN PATENT DOCUMENTS

JP            5-291653        11/1993

OTHER PUBLICATIONS

Toshikazu Hashimoto, et al., "Multichip Optical Hybrid Integration Technique with Planar Lightwave Circuit Platform", Journal of Lightwave Technology, vol. 16, No. 7, Jul. 1998, pp. 1249-1258.
Ken Morito, et al., "A Broad-Band MQW Semiconductor Optical Amplifier with High Saturation Output Power and Low Noise Figure", IEEE Photonics Technology Letters, vol. 17, No. 5, May 2005, pp. 974-976.

* cited by examiner

*Primary Examiner* — Brian Healy
*Assistant Examiner* — Guy Anderson
(74) *Attorney, Agent, or Firm* — Oblon, Spivak, McClelland, Maier & Neustadt, L.L.P.

(57) ABSTRACT

Included are a semiconductor device unit in which a semiconductor optical amplifier and a first semiconductor photo detector being configured to monitor a part of an input light input to the semiconductor optical amplifier or a part of an output light output from the semiconductor optical amplifier are integrated on a mutually same substrate, and a passive waveguide unit connected to the semiconductor device unit and in which a first passive waveguide being configured to cause the input light to be input to the semiconductor optical amplifier or to cause the output light to be output from the semiconductor optical amplifier and a second passive waveguide branching from the first passive waveguide and being configured to cause a part of the input light or a part of the output light to be input to the first semiconductor photo detector are provided on a mutually same substrate.

9 Claims, 9 Drawing Sheets

SEMICONDUCTOR OPTICAL AMPLIFIER MODULE

CROSS-REFERENCE TO RELATED APPLICATION

This application is based upon and claims the benefit of priority from the prior Japanese Patent Application No. 2010-023370, filed on Feb. 4, 2010; the entire contents of which are incorporated herein by reference.

BACKGROUND OF THE INVENTION

1. Field of the Invention

The present invention relates to a semiconductor optical amplifier module.

2. Description of the Related Art

In the field of optical communications, to compensate transmission losses of optical fibers and insertion losses of optical components such as Arrayed Waveguide Grating (AWG) devices, it is very important to employ an optical amplifier having a low noise level and a high gain. In recent years, simple current pumping type semiconductor optical amplifiers (SOAs) have been drawing a lot of attentions because, unlike Erbium (Er)-Doped Fiber Amplifiers (ED-FAs), current pumping type semiconductor optical amplifiers do not require a pump laser and are compact and inexpensive. Further, because semiconductor optical amplifiers are compact, it is possible to integrate a semiconductor optical amplifier with a silicon (Si) waveguide or a silica-based optical waveguide such as a Planar Lightwave Circuit (PLC) in a hybrid manner, while allowing the semiconductor optical amplifier to have the function of, for example, compensating waveguide losses and realizing optical switching (see, for example, T. Hashimoto et al., "Multichip Optical Hybrid Integration Technique with Planar Lightwave Circuit Platform", J. Lightwave Technol., vol. 16, No. 7, pp. 1249-1258, July 1998). At the beginning of development, semiconductor optical amplifiers were found to be not as good as EDFAs in terms of saturation output characteristics thereof and Noise Figure (NF) characteristics thereof; however, as the development has advanced these days, it has been reported that semiconductor optical amplifiers that are comparable to EDFAs in terms of the saturation output characteristics thereof and the Noise Figure characteristics thereof are available (see, for example, K. Morito et al., "A Broad-Band MQW Semiconductor Optical Amplifier With High Saturation Output Power and Low Noise Figure", IEEE Photonics Technol. Lett., vol. 17, No. 5, pp. 974-976, May 2005).

In an actual system, to employ a semiconductor optical amplifier, which is advantageous in terms of the size and the cost as described above, it is necessary to install the semiconductor optical amplifier on a module that is provided with a photo detector (PD) made of semiconductor or the like and being configured so as to monitor powers of optical inputs and outputs and in which an input unit and an output unit are connected to optical fibers.

SUMMARY OF THE INVENTION

It is an object of the present invention to at least partially solve the problems in the conventional technology.

In accordance with one aspect of the present invention, a semiconductor optical amplifier module comprising: a semiconductor device unit in which a semiconductor optical amplifier and a first semiconductor photo detector are integrated on a mutually same substrate, the first semiconductor photo detector being configured so as to monitor a part of an input light that is input to the semiconductor optical amplifier or a part of an output light that is output from the semiconductor optical amplifier; and a passive waveguide unit that is connected to the semiconductor device unit and in which a first passive waveguide and a second passive waveguide are provided on a mutually same substrate, the first passive waveguide being configured so as to cause the input light to be input to the semiconductor optical amplifier or to cause the output light to be output from the semiconductor optical amplifier, and the second passive waveguide branching from the first passive waveguide and being configured so as to cause a part of the input light or a part of the output light to be input to the first semiconductor photo detector.

The above and other objects, features, advantages and technical and industrial significance of this invention will be better understood by reading the following detailed description of presently preferred embodiment of the invention, when considered in connection with the accompanying drawings.

DETAILED DESCRIPTION OF THE PREFERRED EMBODIMENTS

In the following sections, exemplary embodiments of a semiconductor optical amplifier module according to the present invention will be explained in detail, with reference to the accompanying drawings. The present invention is not limited to the exemplary embodiments. It is possible to apply various modifications to the exemplary embodiments without departing from the gist of the present invention.

Figure 16:
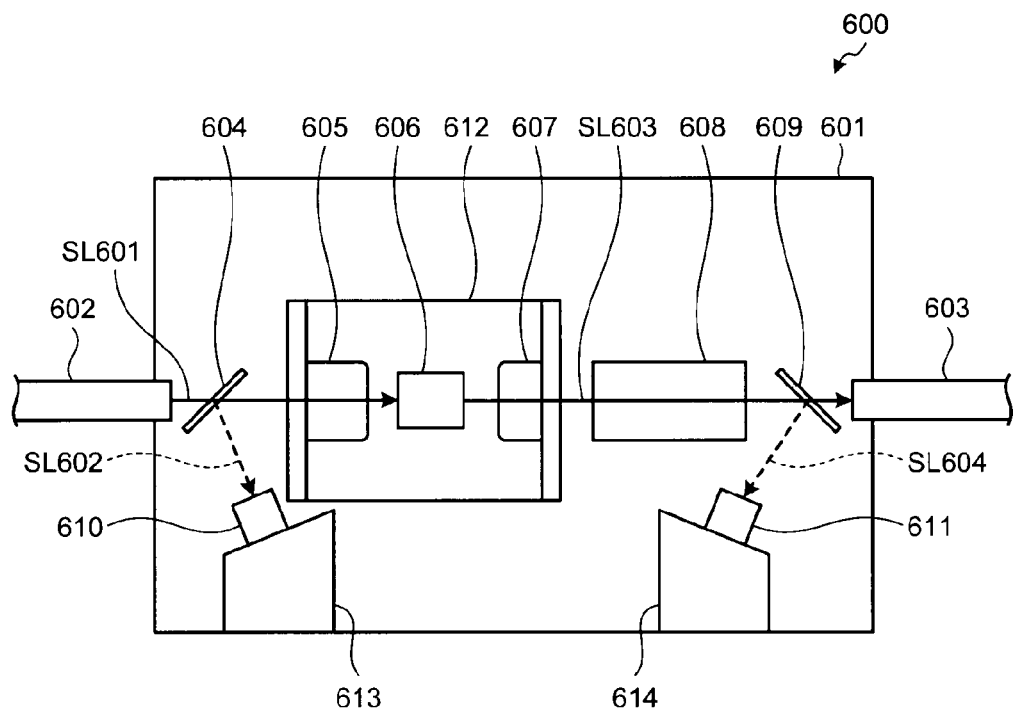
FIG. 16 is a schematic drawing of an example of a conventional semiconductor optical amplifier module.

FIG. 16 is a schematic drawing of an example of a conventional semiconductor optical amplifier module (see, for example, Japanese Patent Application Laid-open No. H5-291653).

As shown in FIG. 16, a semiconductor optical amplifier module 600 includes: an input optical fiber 602 and an output optical fiber 603 that are inserted into and supported by a housing 601; a beam splitter 604, a lens 605, a semiconductor optical amplifier 606 in the form of a chip, a lens 607, an optical isolator 608, and a beam splitter 609 that are housed in the housing 601 and are arranged in a row between the input optical fiber 602 and the output optical fiber 603; a semiconductor photo detector 610 that is in the form of a chip and is disposed in a predetermined position with respect to the beam splitter 604; and a semiconductor photo detector 611 that is in the form of a chip and is disposed in a predetermined position with respect to the beam splitter 609. Further, the lens 605, the semiconductor optical amplifier 606, and the lens 607 are supported by a base 612. The semiconductor photo detector 610 and the semiconductor photo detector 611 are supported by a base 613 and a base 614, respectively.

Next, an operation of the semiconductor optical amplifier module 600 will be explained. First, the beam splitter 604 causes a signal light SL 601 propagated through the input optical fiber 602 to branch, by transmitting a large part of the signal light SL 601 and diffracting another part thereof, so that a branch light SL 602 is input to the semiconductor photo detector 610. The semiconductor photo detector 610 receives the branch light SL 602 and monitors the power of the signal light SL 601, which is an input light.

Subsequently, the lens 607 condenses the signal light SL 601 transmitted through the beam splitter 604 into the semiconductor optical amplifier 606. The semiconductor optical amplifier 606 optically amplifies the signal light SL 601 and outputs an amplified signal light SL 603. Further, the amplified signal light SL 603 is condensed and optically coupled to the output optical fiber 603 by the lens 607. The optical isolator 608 transmits the amplified signal light SL 603, and also, eliminates light returning to the semiconductor optical amplifier 606.

Further, the beam splitter 609 causes the amplified signal light SL 603 to branch, by transmitting a large part of the amplified signal light SL 603 and diffracting another part thereof, so that a branch light SL 604 is input to the semiconductor photo detector 611. The semiconductor photo detector 611 receives the branch light SL 604 and monitors the power of the amplified signal light SL 603, which is an output light. Further, the output optical fiber 603 outputs the amplified signal light SL 603 coupled thereto, to the outside.

The conventional semiconductor optical amplifier module 600 is configured with a plurality of independent semiconductor chips such as the semiconductor optical amplifier 606 and the semiconductor photo detectors 610 and 611. The lenses 605 and 607 are provided between these semiconductor chips so that the optical paths are aligned. For this reason, the number of component parts is large and a problem arises where the size of the module can be large in some situations. In addition, there are a plurality of optical paths that need to be aligned as follows: (1) The input optical fiber 602→the beam splitter 604→the lens 605→the semiconductor optical amplifier 606; (2) the input fiber 602→the beam splitter 604→the semiconductor photo detector 610; (3) the semiconductor optical amplifier 606→the lens 607→the optical isolator 608→the beam splitter 609→the output optical fiber 603; and (4) the semiconductor optical amplifier 606→the lens 607→the optical isolator 608→the beam splitter 609→the semiconductor photo detector 611. Thus, it is necessary to perform the alignment process a plurality of times. Thus, in some situations, the alignment process and the assembly process require a long period of time. Consequently, a problem arises where the productivity is lowered in some situations.

In contrast, according to the exemplary embodiments described below, it is possible to realize a semiconductor optical amplifier module that is compact and has high productivity. The exemplary embodiments described herein relate to a semiconductor optical amplifier module that is suitable for optically amplifying signal light at a wavelength of 1.55 micrometers.

Figure 1:
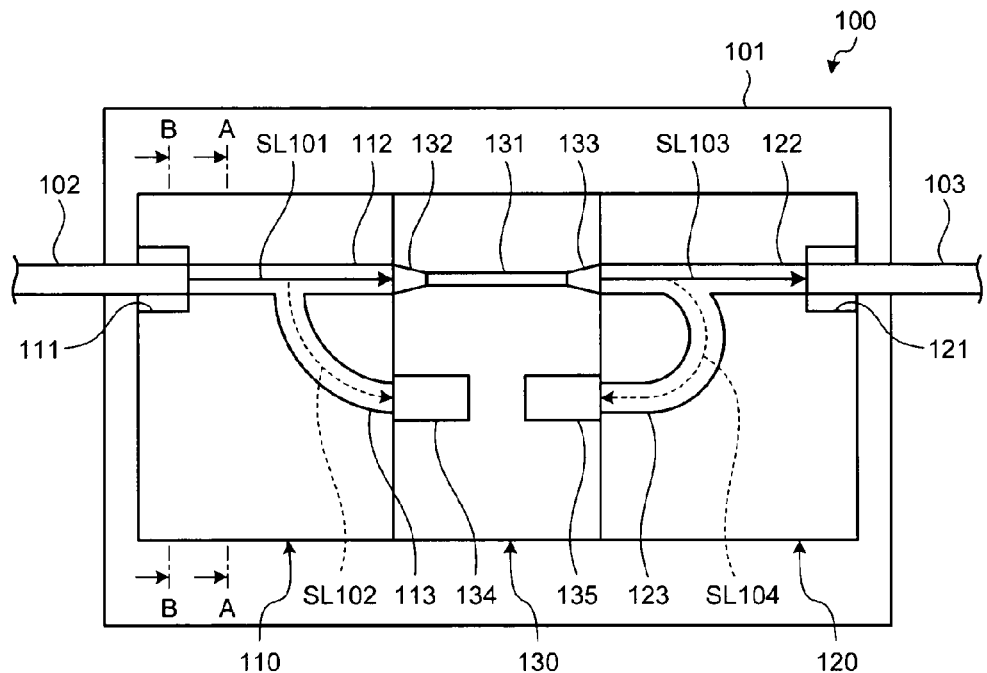
FIG. 1 is a schematic drawing of a semiconductor optical amplifier module according to a first embodiment.

First, a semiconductor optical amplifier module according to a first embodiment of the present invention will be explained. FIG. 1 is a schematic drawing of the semiconductor optical amplifier module according to the first embodiment. As shown in FIG. 1, a semiconductor optical amplifier module 100 includes: an input optical fiber 102 and an output optical fiber 103 that are inserted into and supported by a housing 101; an input-side passive waveguide unit 110 that is housed in the housing 101 and on which the input optical fiber 102 is placed; an output-side passive waveguide unit 120 that is housed in the housing 101 and on which the output optical fiber 103 is placed; and a semiconductor device unit 130 that is interposed between and is connected to the input-side passive waveguide unit 110 and the output-side passive waveguide unit 120.

The input-side passive waveguide unit 110 is configured by using a PLC that is an optical waveguide circuit having a low loss and being made of a silica-based glass material. The input-side passive waveguide unit 110 includes: a V-shaped groove 111 in which the input optical fiber 102 is placed; a first passive waveguide 112 that is optically connected to the input optical fiber 102; and a second passive waveguide 113 that branches from the first passive waveguide 112.

The output-side passive waveguide unit 120 is configured by using a PLC and includes: a V-shaped groove 121 in which the output optical fiber 103 is placed; a first passive waveguide 122 that is optically connected to the output optical fiber 103; and a second passive waveguide 123 that branches from the first passive waveguide 122.

The semiconductor device unit 130 includes: spot size converters (SSC) 132 and 133 that are passive elements and are optically connected to the first passive waveguide 112 included in the input-side passive waveguide unit 110 and to the first passive waveguide 122 included in the output-side passive waveguide unit 120, respectively; a semiconductor optical amplifier 131 that is an active element and is optically connected to the spot size converters 132 and 133; a first semiconductor photo detector 134 that is an active element and is optically connected to the second passive waveguide 113; and a first semiconductor photo detector 135 that is an active element and is optically connected to the second passive waveguide 123. A coupling loss between the semiconductor optical amplifier 131 and the first passive waveguide 122 via the spot size converter 132 is, for example, approximately 2 decibels. A coupling loss between the semiconductor optical amplifier 131 and the second passive waveguide 123 is also similar.

Figure 2:
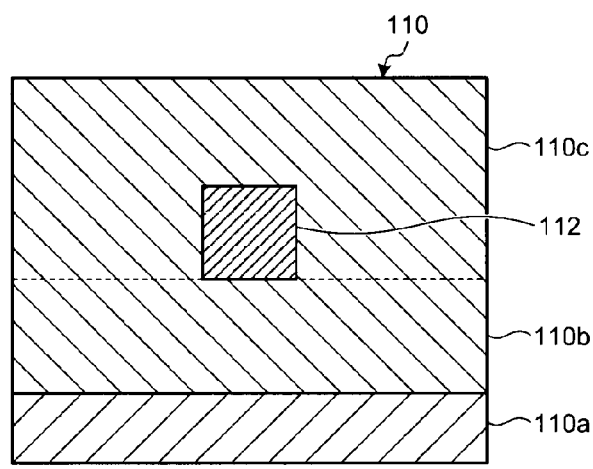
FIG. 2 is a cross-sectional view at a line A-A of a relevant part of the semiconductor optical amplifier module shown in FIG. 1.

Next, the input-side passive waveguide unit 110 and the output-side passive waveguide unit 120 will be explained more specifically. FIG. 2 is a cross-sectional view at a line A-A of a relevant part of the semiconductor optical amplifier module 100 shown in FIG. 1. As shown in FIG. 2, the input-side passive waveguide unit 110 has an buried-mesa type waveguide structure in which, on the cross-sectional plane at the line A-A, the first passive waveguide 112, which is a core layer doped with $Ge_2O_3$, is provided on a lower cladding layer 110b formed on a substrate 110a including Silicon (Si) or the like and is further buried by an upper cladding layer 110c. The cross-sectional dimension of the first passive waveguide 112 is 7 micrometers by 7 micrometers. Further, the refractive indices of the lower cladding layer 110b and the upper cladding layer 110c are equal. Furthermore, the relative refractive index differences of the first passive waveguide 112 with respect to the lower cladding layer 110b and with respect to the upper cladding layer 110c are each 0.45%. Because the cross-sectional dimension and the relative refractive index differences are configured in this manner, the first passive waveguide 112 is able to guide light at a wavelength of 1.55 micrometers in a single transverse mode and in a polarization-independent manner. The cross-sectional dimension and the relative refractive index differences are only examples, and the present invention is not limited to these examples.

Further, the second passive waveguide 113 also has a cross-sectional structure that is the same as that of the first passive waveguide 112. The first passive waveguide 112 and the second passive waveguide 113 are provided on mutually the same substrate, which is the substrate 110a.

Further, the first passive waveguide 122 and the second passive waveguide 123 that are included in the output-side passive waveguide unit 120 each have the same cross-sectional structure as that of the first passive waveguide 112. The first passive waveguide 122 and the second passive waveguide 123 are also provided on mutually the same substrate included in the output-side passive waveguide unit 120.

Figure 3:
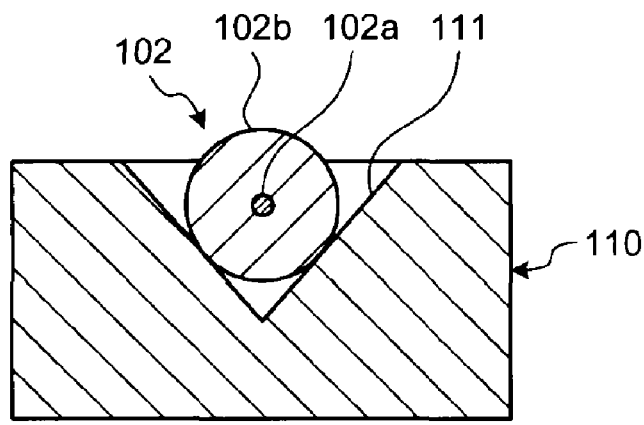
FIG. 3 is a cross-sectional view at a line B-B of a relevant part of the semiconductor optical amplifier module shown in FIG. 1.

FIG. 3 is a cross-sectional view at a line B-B of a relevant part of the semiconductor optical amplifier module 100 shown in FIG. 1. As shown in FIG. 3, the input optical fiber 102 includes a core part 102a and a cladding part 102b and is configured so as to propagate light at a wavelength of 1.55 micrometers in a single transverse mode. For example, the input optical fiber 102 may be a standard single-mode optical fiber that has a zero-dispersion wavelength near the wavelength of 1.3 micrometers, but is not particularly limited to this example. Further, the input optical fiber 102 is placed in the V-shaped groove 111 included in the input-side passive waveguide unit 110 and is fixed and supported by using, for example, an ultraviolet curable resin. The V-shaped groove 111 has an end face that is substantially perpendicular to the groove on the opposite side of an open end thereof. The V-shaped groove 111 is formed so as to have such a shape and to be in such a position that, when the end face is arranged to abut against an end face of the input optical fiber 102, the core part 102a and the first passive waveguide 112 are connected to each other. Further, the V-shaped groove 121 formed in the output-side passive waveguide unit 120 is also formed so as to have such a shape and to be in such a position that the core part of the output optical fiber 103 propagating light at a wavelength of 1.55 micrometers in a single transverse mode is connected to the first passive waveguide 122.

Figure 4:
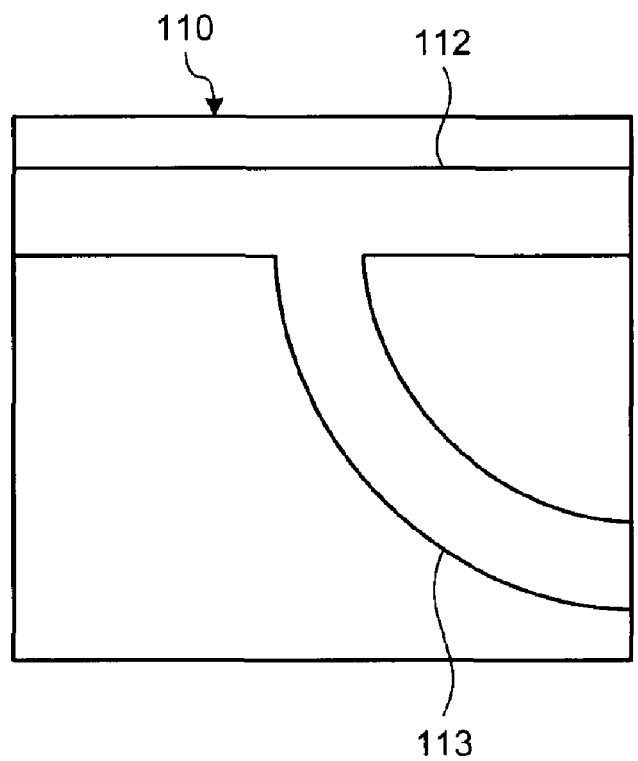
FIG. 4 is a schematic drawing of passive waveguides in an input-side passive waveguide unit included in the semiconductor optical amplifier module shown in FIG. 1.

FIG. 4 is a schematic drawing of the first passive waveguide 112 and the second passive waveguide 113 in the input-side passive waveguide unit 110 included in the semiconductor optical amplifier module 100 shown in FIG. 1. As shown in FIG. 4, the first passive waveguide 112 is formed substantially in the shape of a straight line, whereas the second passive waveguide 113 branches from the first passive waveguide 112. Also, the branching waveguide shown in FIG. 4 may be any of the following: a T-shaped waveguide, a Y-shaped waveguide, a multi-mode interference type waveguide, and a directional coupler type waveguide. The bending radius of the second passive waveguide 113 is, for example, 1 centimeter or smaller, and preferably, is configured with such a dimension that the bending loss of the signal light guided thereby is negligible (e.g., approximately 0.1 decibel).

Figure 5:
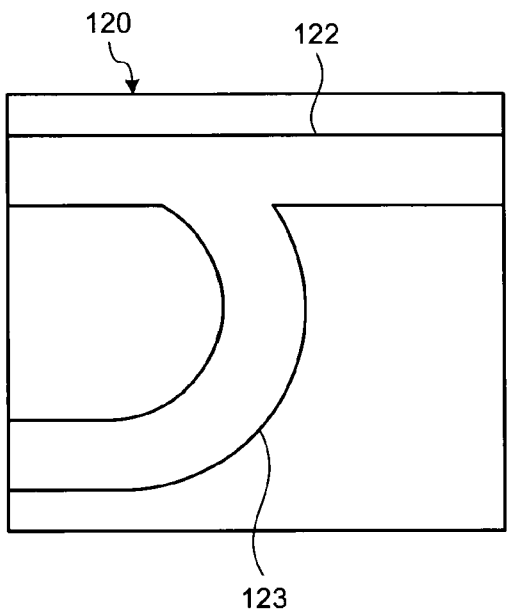
FIG. 5 is a schematic drawing of passive waveguides in an output-side passive waveguide unit included in the semiconductor optical amplifier module shown in FIG. 1.

FIG. 5 is a schematic drawing of the first passive waveguide 122 and the second passive waveguide 123 in the output-side passive waveguide unit 120 included in the semiconductor optical amplifier module 100 shown in FIG. 1. As shown in FIG. 5, the first passive waveguide 122 is formed substantially in the shape of a straight line, whereas the second passive waveguide 123 branches from the first passive waveguide 122 and is bent so that a part thereof is folded back. Because the second passive waveguide 123 is, as a whole, in the shape of a U, the second passive waveguide 123 is compact in the width direction of the drawing page. Also, the branching waveguide shown in FIG. 5 may be any of the following: a T-shaped waveguide, a Y-shaped waveguide, a multi-mode interference type waveguide, and a directional coupler type waveguide. The bending radius of the second passive waveguide 123 is also, for example, 1 centimeter or smaller, and preferably, is configured with such a dimension that the bending loss of the signal light guided thereby is negligible (e.g., approximately 0.1 decibel).

Figure 6:
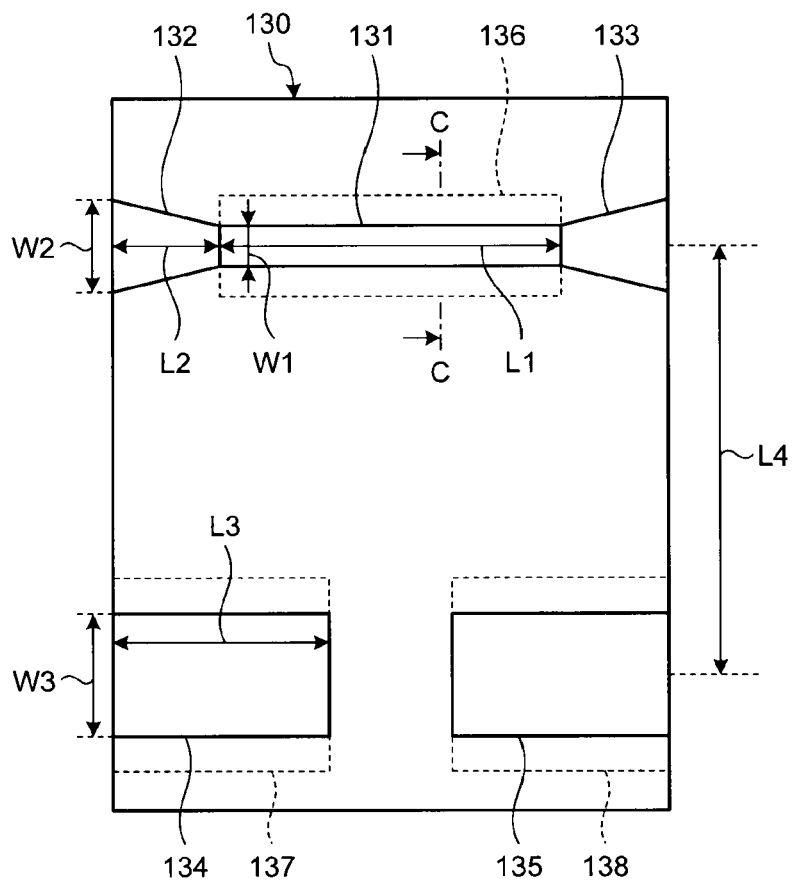
FIG. 6 is a schematic drawing of a semiconductor device unit included in the semiconductor optical amplifier module shown in FIG. 1.

Next, the semiconductor device unit 130 will be explained more specifically. FIG. 6 is a schematic drawing of the semiconductor device unit 130 included in the semiconductor optical amplifier module 100 shown in FIG. 1. The semiconductor optical amplifier 131, the spot size converters 132 and 133, and the first semiconductor photo detectors 134 and 135 each have a buried-mesa type waveguide structure. Also, as shown in FIG. 6, electrode pads 136, 137, and 138 are provided over the semiconductor optical amplifier 131, the first semiconductor photo detector 134, and the first semiconductor photo detector 135, which are active elements, respectively. Further, the length of the semiconductor optical amplifier 131 in the light propagation direction is L1, whereas the mesa width (i.e., the core width) of the semiconductor optical amplifier 131 is W1. The length of each of the spot size converters 132 and 133 is L2. The mesa width of each of the spot size converters 132 and 133 is configured so as to be W1 on the side that is connected to the semiconductor optical amplifier 131, while the mesa width thereof increases up to W2 toward the side that is connected to the first passive waveguide 112 or to the first passive waveguide 122. Further, the length of each of the first semiconductor photo detectors 134 and 135 is L3, whereas the mesa width thereof is W3. The distance between the central axis of the semiconductor optical amplifier 131 and each of the first semiconductor photo detectors 134 and 135 is L4.

The length L1 is equal to 2300 micrometers; the length L2 is equal to 500 micrometers, the length L3 is equal to 1000 micrometers; and the length L4 is equal to 1000 micrometers. The mesa width W1 is equal to 2 micrometers; the mesa width W2 is equal to 10 micrometers; and the mesa width W3 is in the range from 20 micrometers to 30 micrometers. The values of the lengths and the mesa widths presented here are only examples, and the present invention is not limited to these examples.

According to the first embodiment, the spot size converter 132 is shaped so that the mesa width W1 is smaller on the semiconductor optical amplifier 131 side, and the mesa width W2 is larger at the first passive waveguide 112. However, the shape of the spot size converter is not limited to this example. Alternatively, it is acceptable to use a spot size converter that is shaped so that the mesa width is larger on the semiconductor optical amplifier 131 side, whereas the mesa width thereof is smaller at the first passive waveguide 112. The same applies to the spot size converter 133.

Figure 7:
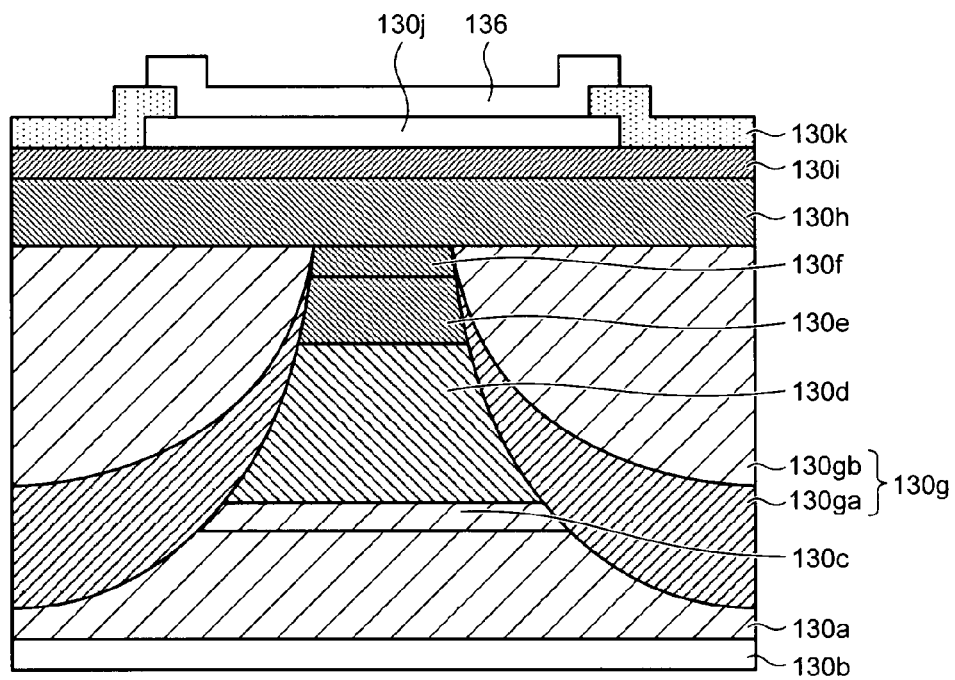
FIG. 7 is a cross-sectional view at a line C-C of a relevant part of the semiconductor device unit shown in FIG. 6.

FIG. 7 is a cross-sectional view at a line C-C of a relevant part of the semiconductor device unit 130 shown in FIG. 6. As shown in FIG. 7, the semiconductor optical amplifier 131 is configured so as to have a structure in which the following layers are laminated on a substrate 130a that includes n-type InP and has an n-side electrode 130b provided on the rear surface thereof: a lower cladding layer 130c that includes n-type InP and that also functions as a buffer layer; an active layer 130d that serves as a core layer; and upper cladding layers 130e and 130f each of which includes p-type InP. A mesa structure is formed in the section from a part of the substrate 130a through the upper cladding layer 130f. The mesa structure is buried by, on both sides thereof, a burying semiconductor layer 130g that includes a lower current-blocking semiconductor layer 130ga including p-type InP and an upper current-blocking semiconductor layer 130gb including n-type InP. Further, on the upper cladding layer 130f and the burying semiconductor layer 130g, an upper cladding layer 130h including p-type InP and a contact layer 130i including p-type InGaAsP are laminated. In addition, on the contact layer 130i, a p-side electrode 130j is provided so as to cover the entirety of the active layer 130d, or a protection is provided by a dielectric protection film 130k that is configured by using an SiN film. Further, the electrode pad 136 is provided so as to be in contact with the p-side electrode 130j at an opening formed in the dielectric protection film 130k.

The active layer 130d is made of an InGaAsP material having a bandgap wavelength of 1.48 micrometers. The active layer 130d has a Multiple Quantum Well-Separate Confinement Heterostructure (MQW-SCH) in which three steps of SCH are formed above and beneath an MQW structure. The MQW has a structure in which, for example, six 6-nanometer well layers and five 10-nanometer barrier layers are sequentially laminated.

Each of the first semiconductor photo detectors 134 and 135 has the same cross-sectional structure as that of the semiconductor optical amplifier 131. The cross-sectional structure of each of the spot size converters 132 and 133 is obtained by replacing the active layer 130d in the cross-sectional structure shown in FIG. 7 with a core layer that is made of an InGaAsP material having a bandgap wavelength of 1.15 micrometers and deleting the p-side electrode 130j and the electrode pad 136 from the cross-sectional structure shown in FIG. 7. In each of the spot size converters 132 and 133, a portion of the lower cladding layer 130c that is positioned adjacent to the core layer as well as the upper cladding layers 130e and 130f each include non-doped InP.

The semiconductor optical amplifier 131, the spot size converters 132 and 133, the first semiconductor photo detectors 134 and 135 described above that are included in the semiconductor device unit 130 are integrated on mutually the same substrate, which is the substrate 130a.

Next, an operation of the semiconductor optical amplifier module 100 will be explained, with reference to FIG. 1. First, while driving electric current is injected into the semiconductor optical amplifier 131 at a forward bias voltage and a reverse bias voltage is being applied to the first semiconductor photo detectors 134 and 135 via the electrodes and the electrode pads, a signal light SL 101 to be amplified is input to the first passive waveguide 112 through the input optical fiber 102.

Subsequently, the first passive waveguide 112 guides a large part of the signal light SL 101 input thereto so that the guided light is output to the spot size converter 132. Along with this, the second passive waveguide 113 guides branch light SL 102, which is a part of the signal light SL 101 branching therefrom, so that the guided light is input to the first semiconductor photo detector 134. The first semiconductor photo detector 134 receives the branch light SL 102 and monitors the power of the signal light SL 101, which is an input light, by monitoring the power of the received branch light SL 102.

After that, the spot size converter 132 converts the input signal light SL 101 so as to reduce the spot size thereof and inputs the converted light to the semiconductor optical amplifier 131. The semiconductor optical amplifier 131 optically amplifies the signal light SL 101 input thereto and outputs an amplified signal light SL 103 to the spot size converter 133. The spot size converter 133 converts the amplified signal light SL 103 input thereto so as to enlarge the spot size thereof and outputs the converted light to the first passive waveguide 122.

After that, the first passive waveguide 122 guides a large part of the amplified signal light SL 103 input thereto so that the guided light is output to the output optical fiber 103. Further, the output optical fiber 103 outputs the amplified signal light SL 103 input thereto, to the outside. Along with this, the second passive waveguide 123 guides branch light SL 104, which is a part of the amplified signal light SL 103 branching therefrom, so that the guided light is input to the first semiconductor photo detector 135. The first semiconductor photo detector 135 receives the branch light SL 104 and monitors the power of the amplified signal light SL 103, which is an output light, by monitoring the power of the received branch light SL 104.

As described above, the semiconductor optical amplifier module 100 is configured so that the input optical fiber 102 is optically connected to the semiconductor optical amplifier 131 and so that the input optical fiber 102 is optically connected to the first semiconductor photo detector 134, by the first passive waveguide 112 and by the second passive waveguide 113 that are provided on mutually the same substrate included in the input-side passive waveguide unit 110, in such a manner that the signal light SL 101 and the branch light SL 102 are received as the inputs. Further, the semiconductor optical amplifier module 100 is configured so that the output optical fiber 103 is optically connected to the semiconductor optical amplifier 131 and so that the output optical fiber 103 is optically connected to the first semiconductor photo detector 135 by the first passive waveguide 122 and by the second passive waveguide 123 that are provided on mutually the same substrate included in the output-side passive waveguide unit 120, in such a manner that the amplified signal light SL 103 is transmitted as the output and so that the branch light SL 104 is received as the input. With these arrangements, the number of component parts used in the semiconductor optical amplifier module 100 is smaller than in the example of the conventional semiconductor optical amplifier module in which these elements are spatially connected together by using the beam splitters and the lenses. Thus, the semiconductor optical amplifier module 100 is more compact. Further, as for the alignment of the optical paths, all that needs to be done is to adjust the positions of the input-side passive waveguide unit 110 to the semiconductor device unit 130 and the positions of the output-side passive waveguide unit 120 to the semiconductor device unit 130. Thus, it is possible to significantly reduce the number of times the alignment process is performed, the degree of difficulty, and the time period required by the alignment process. Consequently, it is possible to achieve extremely high productivity.

Figure 8:
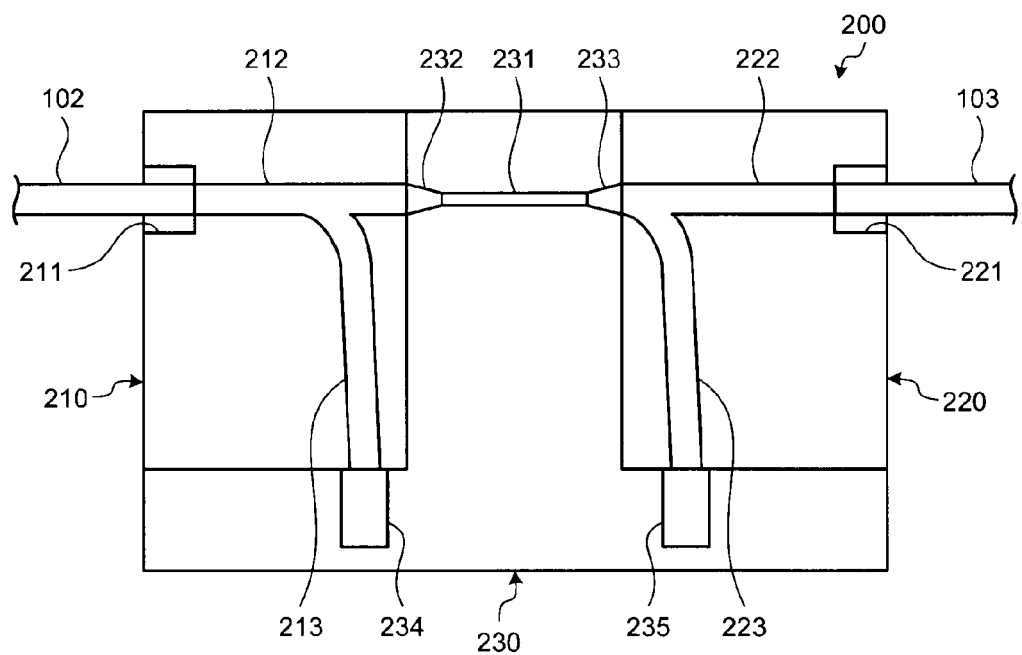
FIG. 8 is a schematic drawing of a semiconductor optical amplifier module according to a second embodiment.

Next, a semiconductor optical amplifier module according to a second embodiment of the present invention will be explained. FIG. 8 is a schematic drawing of the semiconductor optical amplifier module according to the second embodiment. As shown in FIG. 8, a semiconductor optical amplifier module 200 includes: an input-side passive waveguide unit 210 on which the input optical fiber 102 is placed; an output-side passive waveguide unit 220 on which the output optical fiber 103 is placed; and a semiconductor device unit 230 that is formed, in a top view, in the shape of an inverted T obtained by removing parts (hereinafter, "cut-out parts") from a rectangle. The input-side passive waveguide unit 210 and the output-side passive waveguide unit 220 are joined and connected so as to fit to the cut-out parts related to the semiconductor device unit 230. The input optical fiber 102 and the output optical fiber 103 are inserted into and supported by a housing (not shown) that houses therein the input-side passive waveguide unit 210, the output-side passive waveguide unit 220, and the semiconductor device unit 230.

Like the input-side passive waveguide unit 110 according to the first embodiment, the input-side passive waveguide unit 210 is configured by using a PLC that is provided on a single substrate. The input-side passive waveguide unit 210 includes: a V-shaped groove 211 in which the input optical fiber 102 is placed; a first passive waveguide 212 that is optically connected to the input optical fiber 102; and a second passive waveguide 213 that branches from the first passive waveguide 212. It should be noted that, however, unlike the second passive waveguide 113 according to the first embodiment, the second passive waveguide 213 is configured so as to extend toward the bottom portion of the inverted T of the semiconductor device unit 230 after branching.

Like the output-side passive waveguide unit 120 according to the first embodiment, the output-side passive waveguide unit 220 is also configured by using a PLC that is provided on a single substrate. The output-side passive waveguide unit 220 includes: a V-shaped groove 221 in which the output optical fiber 103 is placed; a first passive waveguide 222 that is optically connected to the output optical fiber 103; and a second passive waveguide 223 that branches from the first passive waveguide 222. It should be noted that, however, unlike the second passive waveguide 123 according to the first embodiment, the second passive waveguide 223 is configured so as to extend toward the bottom portion of the inverted T of the semiconductor device unit 230 after branching, like the second passive waveguide 213.

Like the semiconductor device unit 130 according to the first embodiment, the semiconductor device unit 230 includes the following elements that are integrated on mutually the same substrate: spot size converters 232 and 233 that are optically connected to the first passive waveguide 212 included in the input-side passive waveguide unit 210 and to the first passive waveguide 222 included in the output-side passive waveguide unit 220, respectively; a semiconductor optical amplifier 231 that is optically connected to the spot size converters 232 and 233; a first semiconductor photo detector 234 that is disposed in the bottom portion of the inverted T and is optically connected to the second passive waveguide 213; and a first semiconductor photo detector 235 that is disposed in the bottom portion of the inverted T and is optically connected to the second passive waveguide 223.

The materials being used, the cross-sectional structures, the widths, and the lengths of the first passive waveguides 212 and 222, the second passive waveguides 213 and 223, the semiconductor optical amplifier 231, the spot size converters 232 and 233, and the first semiconductor photo detectors 234 and 235 are the same as those of the corresponding constituent elements according to the first embodiment.

Like the semiconductor optical amplifier module 100 according to the first embodiment, the number of component parts used in the semiconductor optical amplifier module 200 is smaller than in the example of the conventional semiconductor optical amplifier module. Thus, the semiconductor optical amplifier module 200 is more compact. Further, as for the alignment of the optical paths, all that needs to be done is to fit the input-side passive waveguide unit 210 and the output-side passive waveguide unit 220 to the cut-out parts related to the semiconductor device unit 230 and to subsequently make some fine-tuning adjustments. Thus, it is possible to significantly reduce the number of times the alignment process is performed, the degree of difficulty, and the time period required by the alignment process. Consequently, it is possible to achieve even higher productivity.

Figure 9:
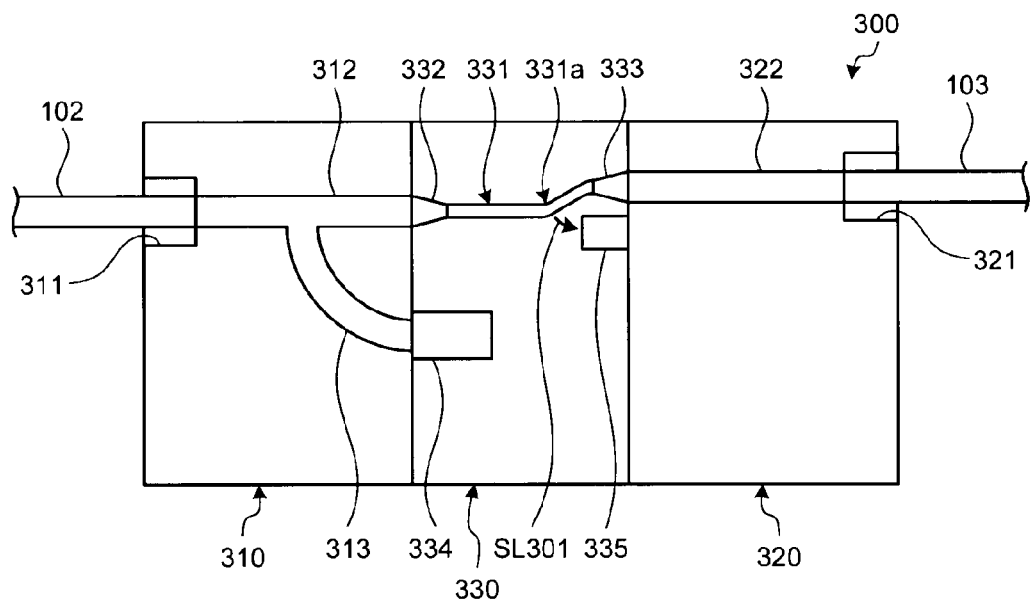
FIG. 9 is a schematic drawing of a semiconductor optical amplifier module according to a third embodiment.

Next, a semiconductor optical amplifier module according to a third embodiment of the present invention will be explained. FIG. 9 is a schematic drawing of the semiconductor optical amplifier module according to the third embodiment. As shown in FIG. 9, a semiconductor optical amplifier module 300 includes: an input-side passive waveguide unit 310 on which the input optical fiber 102 is placed; an output-side passive waveguide unit 320 on which the output optical fiber 103 is placed; and a semiconductor device unit 330 that is interposed between and is connected to the input-side passive waveguide unit 310 and the output-side passive waveguide unit 320. The input optical fiber 102 and the output optical fiber 103 are inserted into and supported by a housing (not shown) that houses therein the input-side passive waveguide unit 310, the output-side passive waveguide unit 320, and the semiconductor device unit 330.

Like the input-side passive waveguide unit 110 according to the first embodiment, the input-side passive waveguide unit 310 is configured by using a PLC that is provided on a single substrate. The input-side passive waveguide unit 310 includes: a V-shaped groove 311 in which the input optical fiber 102 is placed; a first passive waveguide 312 that is optically connected to the input optical fiber 102; and a second passive waveguide 313 that branches from the first passive waveguide 312.

Like the output-side passive waveguide unit 120 according to the first embodiment, the output-side passive waveguide unit 320 is also configured by using a PLC that is provided on a single substrate. The output-side passive waveguide unit 320 includes: a V-shaped groove 321 in which the output optical fiber 103 is placed; and a passive waveguide 322 that is optically connected to the output optical fiber 103. It should be noted, however, that no passive waveguide that branches from the passive waveguide 322 is provided.

Like the semiconductor device unit 130 according to the first embodiment, the semiconductor device unit 330 includes the following elements that are integrated on mutually the same substrate: spot size converters 332 and 333 that are optically connected to the first passive waveguide 312 included in the input-side passive waveguide unit 310 and to the passive waveguide 322 included in the output-side passive waveguide unit 320, respectively; a semiconductor optical amplifier 331 that is optically connected to the spot size converters 332 and 333; a first semiconductor photo detector 334 that is optically connected to the second passive waveguide 313; and a second semiconductor photo detector 335.

The materials being used, the cross-sectional structures, the widths, and the lengths of the first passive waveguide 312, the second passive waveguide 313, the passive waveguide 322, the semiconductor optical amplifier 331, the spot size converters 332 and 333, the first semiconductor photo detector 334, and the second semiconductor photo detector 335 may be the same as those of the corresponding constituent elements according to the first embodiment.

The semiconductor optical amplifier 331 has, as a part thereof, a bending waveguide part 331a. Further, the second semiconductor photo detector 335 is positioned near the bending waveguide part 331a so as to receive and monitor a leaking light SL 301 that leaks from the bending waveguide part 331a. Because the semiconductor optical amplifier module 300 is configured so that the power of the amplified signal light output by the semiconductor optical amplifier 331 is monitored by monitoring the leaking light SL 301, the output-side passive waveguide unit 320 does not need to include any passive waveguide branching from the passive waveguide 322. Thus, it is possible to simplify the waveguide structure of the output-side passive waveguide unit 320.

Further, like the semiconductor optical amplifier module 100 according to the first embodiment, the number of component parts used in the semiconductor optical amplifier module 300 is also smaller than in the example of the conventional semiconductor optical amplifier module. Thus, the semiconductor optical amplifier module 300 is more compact. In addition, it is possible to significantly reduce the number of times the alignment process is performed, the degree of difficulty, and the time period required by the alignment process. Consequently, it is possible to achieve high productivity.

Further, it is desirable to arrange the angle at which the bending waveguide part 331a of the semiconductor optical amplifier 331 is bent so as to be within the range from approximately 6 degrees to 8 degrees with respect to the straight part of the semiconductor optical amplifier 331, and preferably so as to be 7 degrees, because it is possible to keep the bending loss sufficiently small and to keep the power of the leaking light at a level that is sufficient for monitoring the power of the light. The bending angle may be changed, as necessary, according to the refractive index difference between the active layer (i.e., the core layer) and the burying semiconductor layer that are included in the semiconductor optical amplifier 331.

Figure 10:
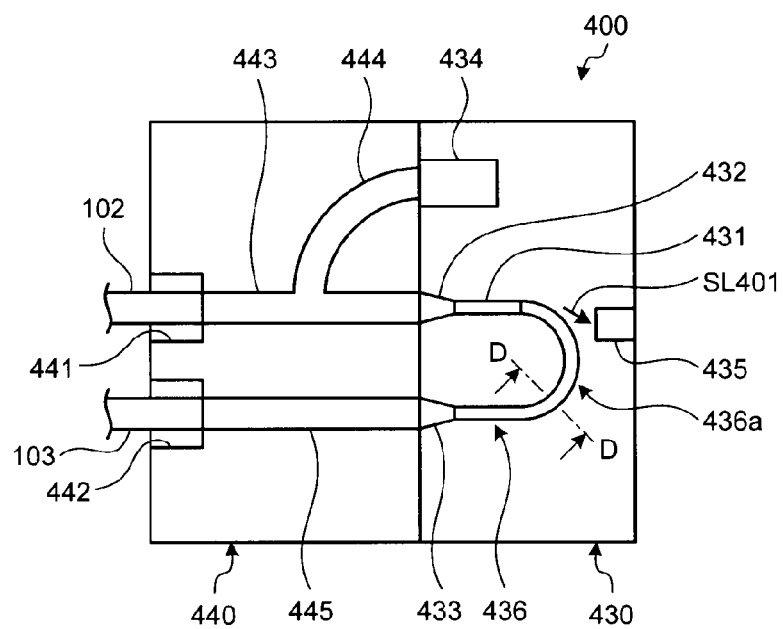
FIG. 10 is a schematic drawing of a semiconductor optical amplifier module according to a fourth embodiment.

Next, a semiconductor optical amplifier module according to a fourth embodiment of the present invention will be explained. FIG. 10 is a schematic drawing of the semiconductor optical amplifier module according to the fourth embodiment. As shown in FIG. 10, a semiconductor optical amplifier module 400 includes: an input/output passive waveguide unit 440 on which the input optical fiber 102 and the output optical fiber 103 are placed; and a semiconductor device unit 430 that is connected to the input/output passive waveguide unit 440. The input optical fiber 102 and the output optical fiber 103 are inserted into and supported by a housing (not shown) that houses therein the input/output passive waveguide unit 440 and the semiconductor device unit 430.

Like the input-side passive waveguide unit 110 according to the first embodiment, the input/output passive waveguide unit 440 is also configured by using a PLC that is provided on a single substrate. The input/output passive waveguide unit 440 includes: a V-shaped groove 441 in which the input optical fiber 102 is placed; a V-shaped groove 442 in which the output optical fiber 103 is placed; a first passive waveguide 443 that is optically connected to the input optical fiber 102; a second passive waveguide 444 that branches from the first passive waveguide 443; and a passive waveguide 445 that is optically connected to the output optical fiber 103.

Like the semiconductor device unit 130 according to the first embodiment, the semiconductor device unit 430 includes the following elements that are integrated on mutually the same substrate: spot size converters 432 and 433 that are optically connected to the first passive waveguide 443 and to the passive waveguide 445, respectively, that are included in the input/output passive waveguide unit 440; a semiconductor optical amplifier 431 that is optically connected to the spot size converter 432; a semiconductor passive waveguide 436 that is provided on the output side of the semiconductor optical amplifier 431 and is optically connected to the semiconductor optical amplifier 431 and to the spot size converter 433; a first semiconductor photo detector 434 that is optically connected to the first passive waveguide 443; and a second semiconductor photo detector 435.

The materials being used, the cross-sectional structures, the widths, and the lengths of the first passive waveguide 443, the second passive waveguide 444, the passive waveguide 445, the semiconductor optical amplifier 431, the spot size converters 432 and 433, the first semiconductor photo detector 434, and the second semiconductor photo detector 435 may be the same as those of the corresponding constituent elements according to the first embodiment.

The semiconductor passive waveguide 436 includes a passive bending waveguide part 436a and is in the shape of a U as a whole, when combined with the semiconductor optical amplifier 431. Further, the semiconductor passive waveguide 436 has a high-mesa type waveguide structure.

Figure 11:
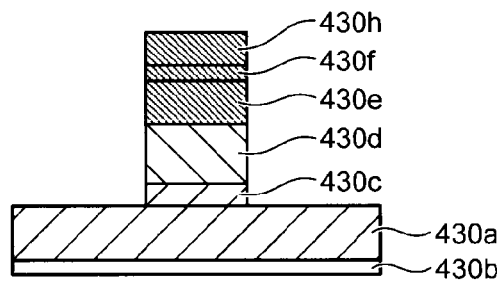
FIG. 11 is a cross-sectional view at a line D-D of a relevant part of the semiconductor optical amplifier module shown in FIG. 10.

FIG. 11 is a cross-sectional view at a line D-D of a relevant part of the semiconductor optical amplifier module 400 shown in FIG. 10. As shown in FIG. 11, the semiconductor passive waveguide 436 is configured so as to have a cross-sectional structure in which the following layers are laminated on a substrate 430a that includes n-type InP and has an n-side electrode 430b formed on the rear surface thereof: a lower cladding layer 430c that includes n-type InP and that also functions as a buffer layer; a core layer 430d that is made of an InGaAsP material having a bandgap wavelength of 1.15 micrometers; non-doped upper cladding layers 430e and 430f; and an upper cladding layer 430h including p-type InP. Further, a high-mesa structure, which is highly resistant to bending, is formed in the section from the lower cladding layer 430c through the upper cladding layer 430h. The thickness of the lower cladding layer 430c is, for example, 0.5 micrometers, whereas the width (i.e., the mesa width) of the core layer 430d is, for example, 2.0 micrometers, and the thickness of the core layer 430d is, for example, 0.3 micrometers. The total thickness of the upper cladding layers 430e through 430h is, for example, 2.5 micrometers. Further, the bending radius of the passive bending waveguide part 436a is, for example, 1.0 centimeter or smaller, and preferably, is configured with such a dimension that the bending loss of the signal light guided thereby is negligible.

As described above, the semiconductor optical amplifier module 400 is configured so that the semiconductor passive waveguide 436 having the passive bending waveguide part 436a is provided on the output side of the semiconductor optical amplifier 431. Further, the second semiconductor photo detector 435 is positioned near the passive bending waveguide part 436a so as to receive and monitor a leaking light SL 401 that leaks from the passive bending waveguide part 436*a*. Because the semiconductor optical amplifier module 400 is configured so that the power of the amplified signal light output by the semiconductor optical amplifier 431 is monitored by monitoring the leaking light SL 401, the input/output passive waveguide unit 440 does not need to include any passive waveguide branching from the passive waveguide 445. Thus, it is possible to simplify the waveguide structure of the input/output passive waveguide unit 440.

Further, the semiconductor optical amplifier module 400 is configured so that the first passive waveguide 443, the second passive waveguide 444, and the passive waveguide 445 that are optically connected to the input optical fiber 102 and the output optical fiber 103 are integrated within the single input/output passive waveguide unit 440. Also, in the semiconductor device unit 430, the optical path is bent so as to be folded back by the semiconductor passive waveguide 436. As a result, in addition to the advantageous effect where the number of component parts being used in the semiconductor optical amplifier module 400 is smaller than in the example of the conventional semiconductor optical amplifier module, the semiconductor optical amplifier module 400 is extremely compact.

Further, as for the alignment of the optical paths in the semiconductor optical amplifier module 400, all that needs to be done is to adjust the positions of the input/output passive waveguide unit 440 to the semiconductor device unit 430. Thus, it is possible to further significantly reduce the number of times the alignment process is performed, the degree of difficulty, and the time period required by the alignment process. Consequently, it is possible to achieve even higher productivity.

The semiconductor optical amplifier module 400 according to the fourth embodiment described above is configured so that the semiconductor device unit 430 is provided with the semiconductor passive waveguide 436 having the passive bending waveguide part 436*a*; however, as long as the passive waveguide having the passive bending waveguide part is provided on the output side of the semiconductor optical amplifier, the position thereof is not limited to a position within the semiconductor device unit. It is also acceptable to provide the passive waveguide having the passive bending waveguide part within a passive waveguide unit positioned on the output side.

Next, a manufacturing method for a semiconductor optical amplifier module according to an aspect of the present invention will be explained, while using an example in which the semiconductor optical amplifier module 100 according to the first embodiment shown in FIG. 1 is manufactured. To begin with, an example of a method for manufacturing the input-side passive waveguide unit 110 will be explained, with reference to FIG. 2. First, glass particles with which the lower cladding layer 110*b* and the core layer (i.e., the passive waveguides 112 and 113) are formed are deposited on the substrate 110*a* (e.g., a silicon substrate) used for manufacturing a PLC, while using a Flame Hydrolysis Deposition (FHD) method to which an optical fiber manufacturing technique is applied. Subsequently, heat is applied thereto so as to melt the glass particles and make the glass particles transparent. After that, by performing a photo lithography process and a Reactive Ion Etching (RIE) process that are of a semiconductor integrated-circuit manufacturing technique, an optical waveguide pattern corresponding to the passive waveguides 112 and 113 is formed. Also, the upper cladding layer 110*c* is formed by, again, using the FHD method. After that, the V-shaped groove 111 is formed, and the input-side passive waveguide unit 110 has thus been manufactured. It is possible to manufacture the output-side passive waveguide unit 120 by using the same method. Further, it is also acceptable to provide the input-side passive waveguide unit 110 and the output-side passive waveguide unit 120 on mutually the same substrate, while providing a space into which the semiconductor device unit 130 can be fitted between the input-side passive waveguide unit 110 and the output-side passive waveguide unit 120. Further, when the input/output passive waveguide unit 440 shown in FIG. 10 is to be manufactured, it is possible to provide the passive waveguides on mutually the same substrate, by using the same method as described above.

Next, a manufacturing method for the semiconductor device unit 130 will be explained. FIGS. 12A to 12C, FIGS. 13A to 13H, and FIGS. 14A to 14G are drawings for explaining an example of a manufacturing method for the semiconductor device unit 130 included in the semiconductor optical amplifier module 100 shown in FIG. 1.

Figure 12A:
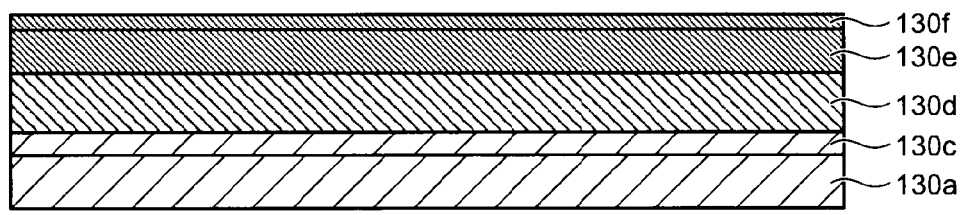
FIGS. 12A, 12B, and 12C are drawings for explaining an example of a manufacturing method for the semiconductor device unit included in the semiconductor optical amplifier module shown in FIG. 1.

First, a crystal growing process as described below is performed at a growth temperature of 600 degrees centigrade, by using a Metal Organic Chemical Vapor Deposition (MOCVD) crystal growing apparatus. More specifically, as shown in FIG. 12A, on the substrate 130*a* including n-type InP, the lower cladding layer 130*c* including n-type InP, the active layer 130*d*, and the upper cladding layers 130*e* and 130*f* each including p-type InP are sequentially grown in the manner of a crystal growth.

Figure 12B:
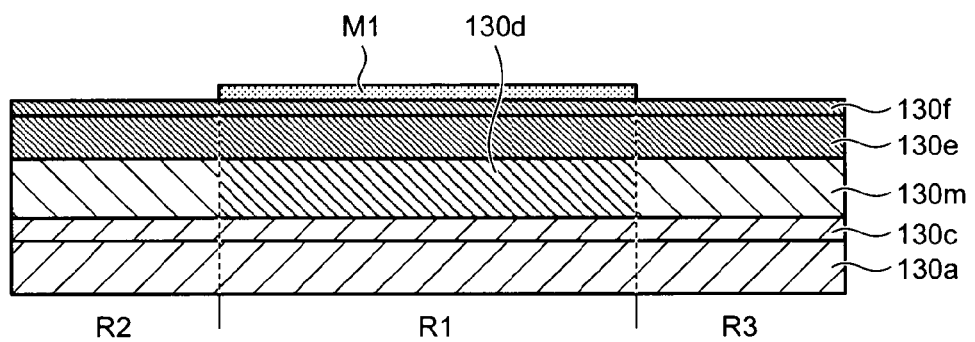
Figure 12C:
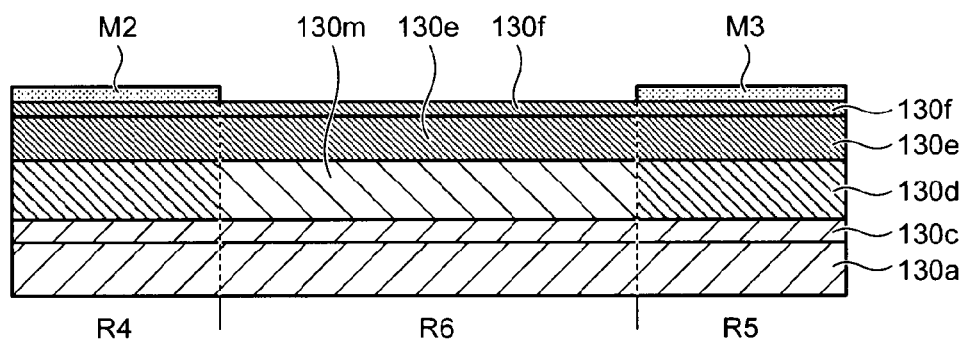

The following steps will be explained, with reference to FIGS. 12B and 12C. In FIG. 12B, a cross-sectional plane that extends across regions R1, R2, and R3 in which the semiconductor optical amplifier 131 and the spot size converters 132 and 133 are to be provided in the semiconductor device unit 130 is shown. In FIG. 12C, a cross-sectional plane that, in the semiconductor device unit 130, extends across regions R4 and R5 in which the first semiconductor photo detectors 134 and 135 are to be provided as well as a region R6 that is positioned between the first semiconductor photo detectors 134 and 135 is shown.

First, with masks M1, M1, and M3 each including SiN, only the regions R1, R4, and R5 in which the semiconductor optical amplifier 131, the first semiconductor photo detectors 134 and 135, which are active elements, are to be provided are covered. In a passive region including the other regions (i.e., R2, R3, and R6), the upper cladding layers 130*e* and 130*f*, the active layer 130*d*, and a portion having the depth of 0.3 micrometer of the lower cladding layer 130*c* are removed by performing an etching process while employing an Inductively Coupled Plasma (ICP)-RIE apparatus. After that, in the regions to which the etching eliminating process has been applied, a portion of the lower cladding layer 130*c* including non-doped InP, a core layer 130*m* made of an InGaAsP material having a bandgap wavelength of 1.15 micrometers, and the upper cladding layers 130*e* and 130*f* each including non-doped InP are formed by performing a butt-joint growing process. After the etching process, the masks M1, M2, and M3 are removed by using Buffered Hydrofluoric Acid (BHA).

Figure 13A:
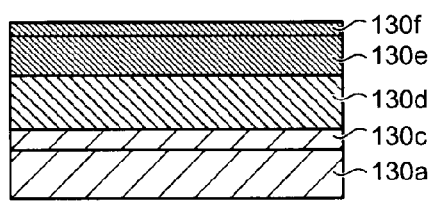
FIGS. 13A to 13H are more drawings for explaining the example of the manufacturing method for the semiconductor device unit included in the semiconductor optical amplifier module shown in FIG. 1.
Figure 13E:
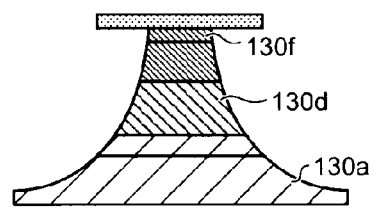
Figure 13B:
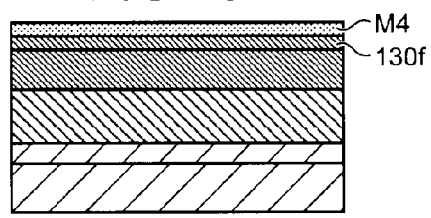
Figure 13F:
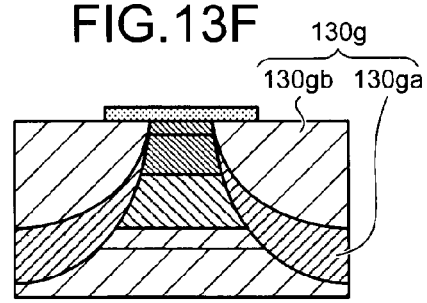
Figure 13C:
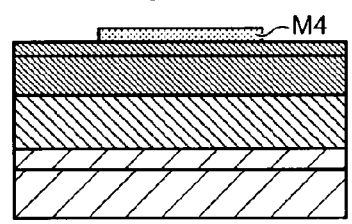
Figure 13G:
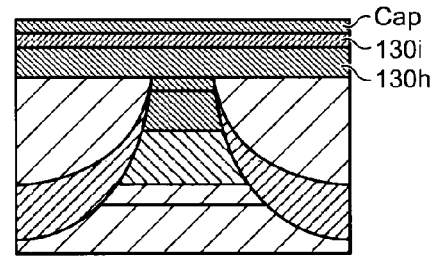
Figure 13D:
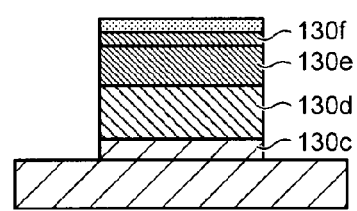

In FIGS. 13A to 13H, a cross-sectional plane corresponding to the one shown in FIG. 7 is shown. FIG. 13A depicts a state obtained after the processes shown in FIGS. 12A to 12C have been performed. After that, as shown in FIGS. 13B and 13C, a mask M4 that is configured by using an SiN film is formed on the entire surface of the upper cladding layer 130*f* in the regions R1 to R5. Subsequently, the mask M4 is etched so as to have a shape for forming the mesa structures of the semiconductor optical amplifier 131, the spot size converters 132 and 133, and the first semiconductor photo detectors 134 and 135 that are shown in FIG. 6. After that, as shown in FIG. 13D, the upper cladding layers 130e and 130f, the active layer 130d (or the core layer 130m), and the lower cladding layer 130c that are in the regions other than the region where the mask M4 has been formed are removed, by performing a dry etching process using a chlorine-based or methane-hydrogen-based gas. Subsequently, as shown in FIG. 13E, the section with a certain depth from the upper cladding layer 130f up to a part of the substrate 130a is further etched by performing a wet etching process, so as to form the mesa structures in the waveguide structures shown in FIG. 7. As a result of these processes, the mesa structures in the regions R1 to R5 have been formed.

Figure 13H:
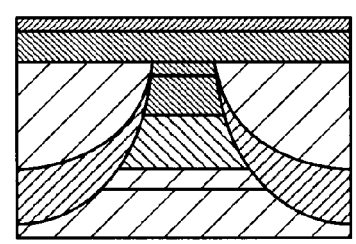

Next, as shown in FIG. 13F, the burying semiconductor layer 130g is formed by sequentially forming the lower current-blocking semiconductor layer 130ga and the upper current-blocking semiconductor layer 130gb, so that the entire region including the mesa structures within the regions R1 to R5 is buried. After that, the mask M4 is removed by using BHF. Subsequently, as shown in FIG. 13G, the upper cladding layer 130h and the contact layer 130i are formed in the entire region. Further, if necessary, a cap layer Cap serving as a protection layer is formed. The cap layer Cap is subsequently removed, as shown in FIG. 13H.

Figure 14A:
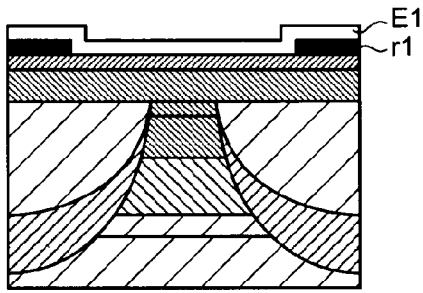
FIGS. 14A to 14G are more drawings for explaining the example of the manufacturing method for the semiconductor device unit included in the semiconductor optical amplifier module shown in FIG. 1.
Figure 14B:
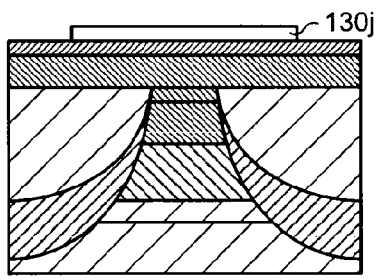
Figure 14C:
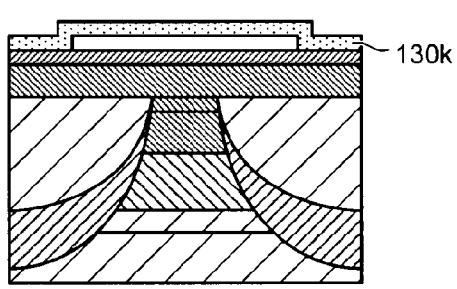
Figure 14D:
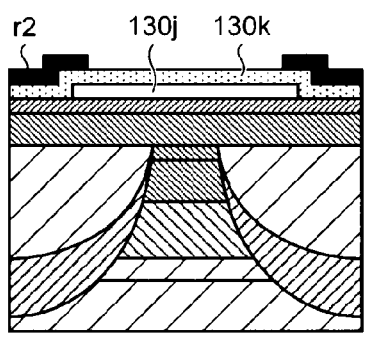

Next, a process for forming a structure of the semiconductor optical amplifier 131 will be explained. It is possible to form the semiconductor photo detectors 134 and 135, by performing the same process. First, as shown in FIG. 14A, a resist r1 patterned with a portion corresponding to the p-side electrode 130j is formed over the structure formed as shown in FIG. 13H, by performing a photo lithography process. After that, an AuZn film E1 is deposited thereon. Subsequently, as shown in FIG. 14B, the resist r1 is removed and a lift-off process is performed so as to form the p-side electrode 130j. After that, as shown in FIG. 14C, the dielectric protection film 130k that is configured by using an SiN film is formed. The dielectric protection film 130k is formed in the entire region. After that, as shown in FIG. 14D, a resist r2 patterned with a portion in which the electrode pad 136 is brought into contact with the p-side electrode 130j is formed over the dielectric protection film 130k by performing a photo lithography process.

Figure 14E:
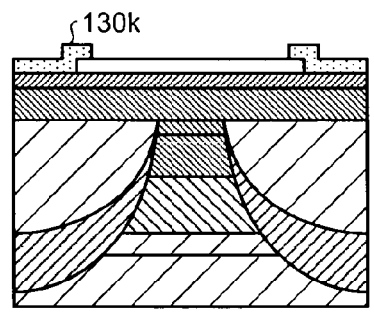
Figure 14F:
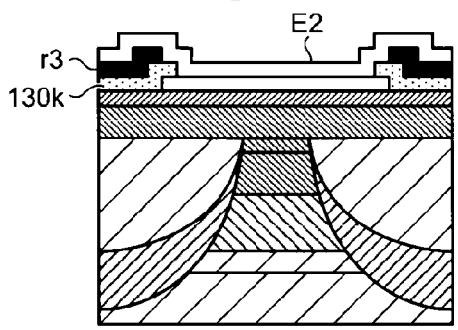
Figure 14G:
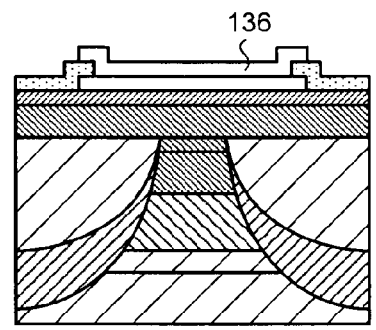

Subsequently, as shown in FIG. 14E, the dielectric protection film 130k in the portion where the resist r2 has been patterned is etched by performing an RIE process that uses $CF_4$ gas. After that, the resist r2 is removed. Further, as shown in FIG. 14F, a resist r3 patterned with a portion corresponding to the electrode pad 136 is formed over the dielectric protection film 130k by performing a photo lithography process. After that, a Ti/Pt film E2 is deposited thereon. Subsequently, as shown in FIG. 14G, the resist r3 is removed and a lift-off process is performed so as to form the electrode pad 136.

Finally, the entire back surface of the substrate 130a is polished, so that an AuGeNi/Au film is deposited on the polished back surface, and the n-side electrode 130b is formed. After that, to realize ohmic contact, a sintering process is performed at a temperature of 430 degrees centigrade. After that, a cleaving process is performed to realize the shape of the semiconductor device unit 130, and also, for the purpose of inhibiting reflections on the facets, an Anti-Reflection (AR) coating is applied to both facets where the spot size converters 132 and 133 and the semiconductor photo detectors 134 and 135 are provided. Thus, the semiconductor device unit 130 has been completed.

Subsequently, the input-side passive waveguide unit 110 and the output-side passive waveguide unit 120 that have separately been prepared are positioned adjacent to the semiconductor device unit 130 on either side thereof, so that an alignment process is performed by using an active alignment method or a passive alignment method. After that, the semiconductor device unit 130, the input-side passive waveguide unit 110, and the output-side passive waveguide unit 120 are joined together and fixed by using a joining ultraviolet-curable resin or the like, so as to be integrated in a hybrid manner. Further, the semiconductor device unit 130, the input-side passive waveguide unit 110, and the output-side passive waveguide unit 120 that are joined together are housed into the housing 101, so that necessary electric wirings are provided. In addition, the input optical fiber 102 and the output optical fiber 103 are placed and fixed in the V-shaped grooves 111 and 121, respectively. The housing 101 is then sealed, and the semiconductor optical amplifier module 100 has thus been completed.

When the input-side passive waveguide unit 110 and the output-side passive waveguide unit 120 are provided on mutually the same substrate, the semiconductor device unit 130 is fitted between the input-side passive waveguide unit 110 and the output-side passive waveguide unit 120. After that, an alignment process is performed by using an active alignment method or a passive alignment method. Subsequently, the semiconductor device unit 130 is joined and fixed by using an ultraviolet curable resin or the like.

During the alignment process described above, all that needs to be done is to adjust the positions of the input-side passive waveguide unit 110 to the semiconductor device unit 130 and the positions of the output-side passive waveguide unit 120 to the semiconductor device unit 130. Thus, it is possible to significantly reduce the number of times the alignment process is performed, the degree of difficulty, and the time period required by the alignment process. Consequently, it is possible to achieve extremely high productivity.

An alignment process that uses the passive alignment method is described in, for example, T. Hashimoto et al., "Multichip Optical Hybrid Integration Technique with Planar Lightwave Circuit Platform", J. Lightwave Technol., vol. 16, No. 7, pp. 1249-1258, July 1998. When the passive alignment method is used, alignment marks are formed on the input-side passive waveguide unit 110, the output-side passive waveguide unit 120, and the semiconductor device unit 130, so as the alignment process can be performed by using the alignment marks. Thus it is possible to realize a simplified alignment process.

When the alignment process is performed by using the active alignment method, test light is input through the input optical fiber 102, so that the test light is amplified by an operation of the semiconductor optical amplifier 131 and so that the amplified light is output from the semiconductor optical amplifier 131. In this situation, the alignment process is performed by adjusting the positions while monitoring, on the output-terminal side of the output optical fiber 103, the power of the amplified test light. When the active alignment method is used, it is possible to perform the alignment process with a high level of precision yielding a smaller coupling loss, while easily realizing the alignment process in a short period of time.

To form a high-mesa type waveguide like the semiconductor passive waveguide 436 included in the semiconductor optical amplifier module 400 according to the fourth embodiment, before or after the electrode structure is formed according to the manufacturing method described above, the high-mesa structure can be formed by performing a dry etching process while employing an ICP-RIE apparatus, with the use of a mask including SiN.

Further, in the semiconductor optical amplifier module according to any of the exemplary embodiments described above, the shape and the structure of the branching waveguide included in the passive waveguide unit is not limited to those described above. It is possible to adopt a branching waveguide having a shape and a structure selected from various shapes and various structures. Further, it is also possible to configure the branching waveguide by using a Mach-Zehnder waveguide or a Multi-Mode Interference (MMI) waveguide.

Figure 15:
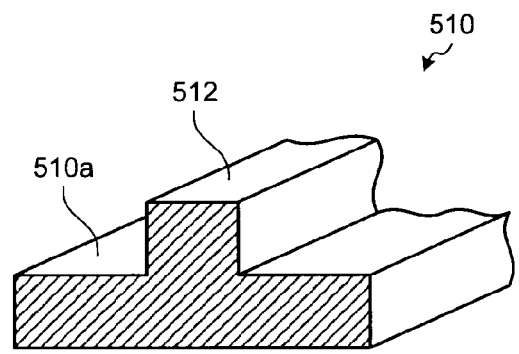
FIG. 15 is a schematic cross-sectional view of a passive waveguide unit configured by using a silicon (Si) wire.

Further, the material for and the structure of the passive waveguide unit included in the semiconductor optical amplifier module according to any of the exemplary embodiments described above are not particularly limited. For example, it is possible to configure the passive waveguide unit by using a silicon (Si) wire. FIG. 15 is a schematic cross-sectional view of a passive waveguide unit configured by using a Si wire. A passive waveguide unit 510 is obtained by providing a Si wire 512, which is a ridge-type waveguide, on a substrate 510a including Si. The cross-sectional dimension of the Si wire 512 is, for example, equal to or smaller than 0.5 micrometer by 0.5 micrometer. Because the refractive index difference of the Si wire 512 with respect to the air that surrounds the Si wire 512 and that functions as cladding is large, even if the bending radius is arranged to be in the range from a few micrometers to 10 micrometers, the bending loss is sufficiently small to be negligible. Thus, it is possible to integrate the Si wire 512 in a small area without being affected by the bending loss. Consequently, the Si wire 512 is suitable for making the semiconductor optical amplifier module even more compact.

Furthermore, it is acceptable to configure the passive waveguide unit included in the semiconductor optical amplifier module according to any of the exemplary embodiments described above, with a polymer waveguide that is configured by using an optical polymer such as an ultraviolet epoxy resin or a fluorinated polyimide. The structure of such a polymer waveguide is not particularly limited and may be, for example, of a buried-mesa type as shown in FIG. 2 or of a ridge-type as shown in FIG. 15.

Further, the semiconductor optical amplifier module according to any of the exemplary embodiments described above is configured so that the materials for and the dimensions of the compound semiconductors and the electrodes are suitable for the wavelength of 1.55 micrometers; however, the materials, the dimensions, and the like are not particularly limited, and it is possible to select, as necessary, the materials and the dimensions in accordance with the wavelength or the like of the signal light being used.

Further, the present invention includes any other configurations obtained by combining, as necessary, two or more of the constituent elements in any of the exemplary embodiments.

As explained above, the semiconductor optical amplifier module according to aspects of the present invention is suitable for applications in the field of optical communications.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor optical amplifier module comprising:
a semiconductor device unit in which a semiconductor optical amplifier and a first semiconductor photo detector are integrated on a mutually same substrate, the first semiconductor photo detector being configured so as to monitor a part of an input light that is input to the semiconductor optical amplifier or a part of an output light that is output from the semiconductor optical amplifier; and
a passive waveguide unit that is connected to the semiconductor device unit and in which a first passive waveguide and a second passive waveguide are provided on a mutually same substrate, the first passive waveguide being configured so as to cause the input light to be input to the semiconductor optical amplifier or to cause the output light to be output from the semiconductor optical amplifier, and the second passive waveguide branching from the first passive waveguide and being configured so as to cause a branched part of the input light guided by the first passive waveguide or a branched part of the output light guided by the first passive waveguide to be input to the first semiconductor photo detector.

2. A semiconductor optical amplifier module comprising:
a semiconductor device unit in which a semiconductor optical amplifier and a first semiconductor photo detector are integrated on a mutually same substrate, the first semiconductor photo detector being configured so as to monitor a part of an input light that is input to the semiconductor optical amplifier or a part of an output light that is output from the semiconductor optical amplifier; and
a passive waveguide unit that is connected to the semiconductor device unit and in which a first passive waveguide and a second passive waveguide are provided on a mutually same substrate, the first passive waveguide being configured so as to cause the input light to be input to the semiconductor optical amplifier or to cause the output light to be output from the semiconductor optical amplifier, and the second passive waveguide branching from the first passive waveguide and being configured so as to cause a part of the input light or a part of the output light to be input to the first semiconductor photo detector, wherein
the semiconductor optical amplifier includes a bending waveguide part, and
the semiconductor device unit includes a second semiconductor photo detector configured so as to monitor a light leaking from the bending waveguide part.

3. A semiconductor optical amplifier module comprising:
a semiconductor device unit in which a semiconductor optical amplifier and a first semiconductor photo detector are integrated on a mutually same substrate, the first semiconductor photo detector being configured so as to monitor a part of an input light that is input to the semiconductor optical amplifier or a part of an output light that is output from the semiconductor optical amplifier; and
a passive waveguide unit that is connected to the semiconductor device unit and in which a first passive waveguide and a second passive waveguide are provided on a mutually same substrate, the first passive waveguide being configured so as to cause the input light to be input to the semiconductor optical amplifier or to cause the output light to be output from the semiconductor optical amplifier, and the second passive waveguide branching from the first passive waveguide and being configured so as to cause a part of the input light or a part of the output light to be input to the first semiconductor photo detector, wherein one of the semiconductor device unit and the passive waveguide unit includes a passive bending waveguide part provided on an output side of the semiconductor optical amplifier, and the semiconductor device unit includes a second semiconductor photo detector configured so as to monitor light leaking from the passive bending waveguide part.

4. A semiconductor optical amplifier module comprising:

a semiconductor device unit in which a semiconductor optical amplifier and a first semiconductor photo detector are integrated on a mutually same substrate, the first semiconductor photo detector being configured so as to monitor a part of an input light that is input to the semiconductor optical amplifier or a part of an output light that is output from the semiconductor optical amplifier; and a passive waveguide unit that is connected to the semiconductor device unit and in which a first passive waveguide and a second passive waveguide are provided on a mutually same substrate, the first passive waveguide being configured so as to cause the input light to be input to the semiconductor optical amplifier or to cause the output light to be output from the semiconductor optical amplifier, and the second passive waveguide branching from the first passive waveguide and being configured so as to cause a part of the input light or a part of the output light to be input to the first semiconductor photo detector, wherein the semiconductor device unit and the passive waveguide unit are connected to each other by adjusting positions thereof by using an active alignment method, while an output light that is output from the semiconductor optical amplifier is being monitored.

5. The semiconductor optical amplifier module according to any one of claims 1 and 2-4, wherein the passive waveguide unit is configured with a planar optical circuit that is made by using glass.

6. The semiconductor optical amplifier module according to any one of claims 1 and 2-4, wherein the passive waveguide unit is configured by using a silicon waveguide.

7. The semiconductor optical amplifier module according to any one of claims 1 and 2-4, wherein the passive waveguide unit is configured with a polymer waveguide.

8. The semiconductor optical amplifier module according to any one of claims 1 and 2-4, wherein a part of the second passive waveguide is bent so as to be folded back.

9. The semiconductor optical amplifier module according to claim 8, wherein a bending radius of the part of the second passive waveguide is 1 centimeter or smaller.

\* \* \* \* \*